United States Patent
van Aken et al.

(10) Patent No.: US 10,714,643 B2
(45) Date of Patent: Jul. 14, 2020

(54) BACK SIDE CONTACT LAYER FOR PV MODULE WITH MODIFIED CELL CONNECTION TOPOLOGY

(71) Applicant: Stichting Energieonderzoek Centrum Nederland, Petten (NL)

(72) Inventors: Bas Bernardus van Aken, Petten (NL); Evert Eugène Bende, Petten (NL); Antonius Radboud Burgers, Petten (NL); Markus Johan Jansen, Petten (NL)

(73) Assignee: NEDERLANDSE ORGANISATIE VOOR TOEGEPAST—NATUURWETENSCHAPPELIJK ONDERZOEK TNO, The Hague (NL)

( * ) Notice: Subject to any disclaimer, the term of this patent is extended or adjusted under 35 U.S.C. 154(b) by 0 days.

(21) Appl. No.: 15/300,287

(22) PCT Filed: Mar. 31, 2015

(86) PCT No.: PCT/EP2015/057012
§ 371 (c)(1),
(2) Date: Sep. 29, 2016

(87) PCT Pub. No.: WO2015/150379
PCT Pub. Date: Oct. 8, 2015

(65) Prior Publication Data
US 2017/0186900 A1   Jun. 29, 2017

(30) Foreign Application Priority Data
Apr. 2, 2014 (NL) .................................. 2012553

(51) Int. Cl.
*H01L 31/05* (2014.01)
*H01L 31/044* (2014.01)
(Continued)

(52) U.S. Cl.
CPC .... *H01L 31/0516* (2013.01); *H01L 31/02013* (2013.01); *H01L 31/044* (2014.12); *H02S 40/34* (2014.12); *Y02E 10/50* (2013.01)

(58) Field of Classification Search
CPC ............. H01L 31/0516; H01L 31/044; H01L 31/02013; H02S 40/34
(Continued)

(56) References Cited

U.S. PATENT DOCUMENTS

| 2006/0180196 A1* | 8/2006 | Lares | H01R 4/70 136/251 |
| 2009/0139557 A1* | 6/2009 | Rose | H01L 31/18 136/244 |

(Continued)

FOREIGN PATENT DOCUMENTS

| EP | 2226850 A1 | 9/2010 |
| KR | 20100026291 A | 3/2010 |

(Continued)

*Primary Examiner* — Magali P Slawski
*Assistant Examiner* — Kourtney R S Carlson
(74) *Attorney, Agent, or Firm* — N.V. Nederlandsch Octrooibureau; Catherine A. Shultz; Katelyn J. Bernier

(57) ABSTRACT

Back side connection layer for a photo-voltaic module comprising a plurality of PV-cells (i,j), the plurality PV-cells (i,j) being of a type having one or more back side contacts and divided in a preset number of strings (3) of series connected PV-cells (i. j). By-pass diodes are connectable in parallel to each of the preset number of strings (3), and three or more strings (3) are provided. The plurality of PV-cells (i,j) are positioned such that electrical connections to the first PV-cell and last PV-cell of each of the preset number of strings (3) are provided in a part of the back side connection layer overlapping a part of a two-by-two arrangement of PV-cells (i,j).

17 Claims, 5 Drawing Sheets

(51) Int. Cl.
*H02S 40/34* (2014.01)
*H01L 31/02* (2006.01)

(58) Field of Classification Search
USPC .................................................. 136/242–265
See application file for complete search history.

(56) References Cited

U.S. PATENT DOCUMENTS

2010/0012172 A1* 1/2010 Meakin ................. H01L 31/048
 136/251
2011/0220168 A1 9/2011 Park
2012/0260973 A1* 10/2012 Telle ............... H01L 31/022441
 136/251

FOREIGN PATENT DOCUMENTS

WO 2009/134939 A2 11/2009
WO 2013/182955 A2 12/2013

\* cited by examiner

BACK SIDE CONTACT LAYER FOR PV MODULE WITH MODIFIED CELL CONNECTION TOPOLOGY

FIELD OF THE INVENTION

The present invention relates to a back side connection layer (such as a foil or substrate) for a photo-voltaic module comprising a plurality of PV-cells the plurality PV-cells being of a type having one or more back side contacts. The plurality of PV cells is divided in a preset number of strings of series connected PV-cells and by-pass diodes are connectable in parallel to each of the preset number of strings.

PRIOR ART

International patent publication WO2013/182955 discloses a back-sheet for photovoltaic modules comprising back-contact solar cells. A conductive back-sheet is provided formed as a connecting circuit to electrodes of the solar cells of the module.

In general PV panel implementations, cross connectors placed outside the cell areas can connect cells to the junction box, widely used in industry for soldered H-pattern modules. Such a solution increases the area/size of the module, is not esthetic and increases the number of contacts and handling to be done at manufacturing of the PV panel.

International patent publication WO2009/134939 discloses photovoltaic modules manufactured using monolithic module assembly techniques. An embodiment is disclosed wherein the cells of the photovoltaic module are arranged in a 6×10 array and are interconnected by a non-linear circuit path.

SUMMARY OF THE INVENTION

The present invention seeks to provide an improved back side contact layer for a photovoltaic module allowing incorporation of a by-pass circuit with as little as possible further modifications to the photovoltaic module, such as additional wiring or circuitry.

According to the present invention, a back side connection layer according to the preamble defined above is provided, wherein the preset number of strings is three or more, and connections to the plurality of PV-cells are provided on the back side connection layer which are positioned such that external electrical connections to the first PV-cell and last PV-cell of each of the preset number of strings are provided in a part of the back side connection layer overlapping a part of a two-by-two arrangement of PV-cells. This allows easy integration of and manufacture of a PV module having by-pass diode functionality without needing any additional wiring or circuitry.

SHORT DESCRIPTION OF DRAWINGS

The present invention will be discussed in more detail below, using a number of exemplary embodiments, with reference to the attached drawings, in which FIG. 1 shows a schematic view of a PV panel with multiple strings, according to a prior art embodiment;

DETAILED DESCRIPTION OF EXEMPLARY EMBODIMENTS

If two cells in a photovoltaic module with a plurality of PV-cells are adjacent and both cells have contacts on the back side of the solar cell and some of the contacts are positioned along neighboring edges of these cells, then in between the cells there is hardly any room for a Cu-strip that is extending towards the junction box. The space between the contacts of two neighboring cells is small. Moreover to manufacture the strip, isolation scribes of typically 1 mm are needed, which also 'eats' away conductive material in between the contacts. This then would lead to a very small strip that should be able to carry a current of typically 9 A and would therefore lead to a high power dissipation, which can be detrimental to the device and has an adverse effect of module operation under shade conditions.

Figure 1:
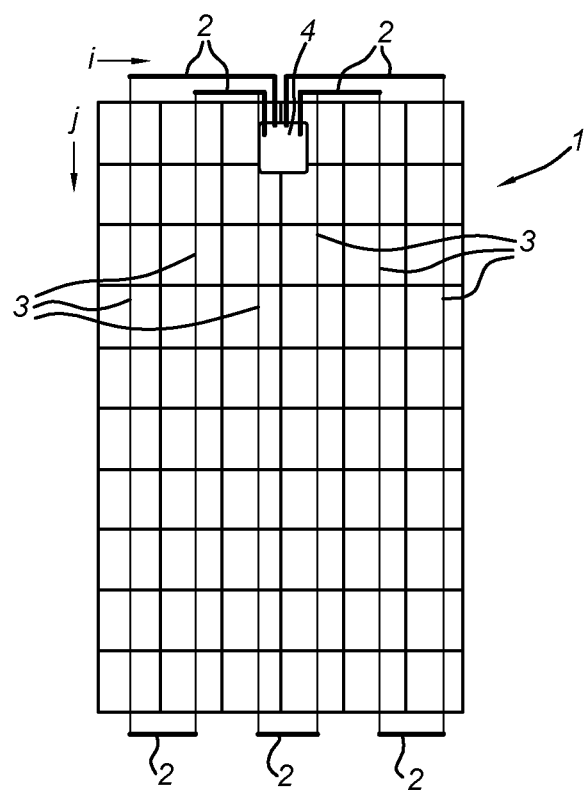

FIG. 1 shows a typical interconnect lay-out of a 6×10 array of cells i,j, having a junction box 4 attached to the back side of the panel, in contact with a back side connection layer (sheet or substrate). In the back side connection layer, connection points of adjacent cells i,j are connected in series using connection parts of the connection layer 3, which in the simplified view of FIG. 1 are indicated as straight lines connecting the columns of the 6×10 array. The strings of PV cells i,j (in this case three) are brought to the junction box 4 using interconnects 2.

According to the present invention embodiments, the contacts for the bypass diode can be directly accessed from the junction box without Cu strips, isolation scribes or Cu cross-connectors outside the active area of the module, by rearranging the topology of the serial interconnection of the cells. In general words, a back side connection layer is provided wherein the plurality of PV cells i,j is divided in a preset number (three or more) of strings 3 of series connected PV-cells i,j, and by-pass diodes are connectable in parallel to each of the preset number of strings 3. Contacts to the plurality of PV-cells i,j are provided on the back side connection layer which are positioned such that directly accessible (or external) electrical connections to the first PV-cell and last PV-cell of each of the preset number of strings 3 are provided in a part of the back side connection layer overlapping a part of a two-by-two arrangement of PV-cells i,j.

Figure 2A:
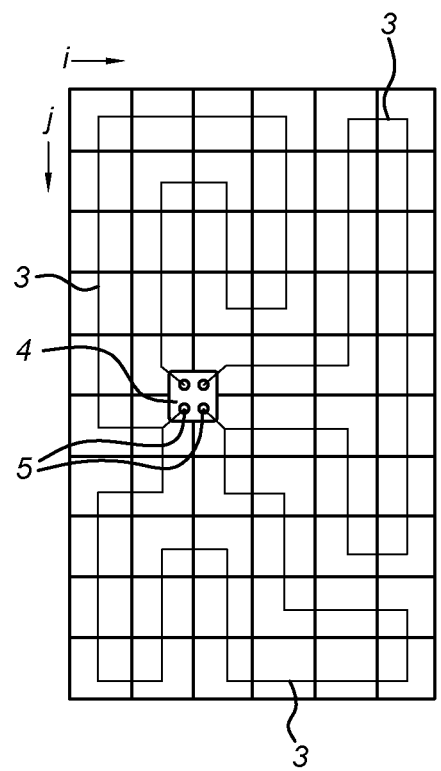
FIGS. 2a and 2b show schematic views of a PV panel with multiple strings, arranged according to an embodiment of the present invention.

In the embodiment of FIG. 2a, the junction box 4 is positioned over four cells, i.e. the cells (2,5); (2,6); (3,5); (3,6), when taking the indices i and j along the 6×10 array f cells i,j. All 60 cells are connected in series in three strings, as indicated by the string lines 3 in FIG. 2a. The configuration can be made that each string comprises 20 cells i,j.

In more general terms, the part of the back side connection layer overlaps four adjacent corner areas of the two-by-two arrangement of PV-cells i,j. With proper alignment of the connection layer lay-out the needed overlap is e.g. only a quarter of the surface a cell i,j per cell of the two-by-two arrangement of PV-cells i,j, or even less.

The back side connection layer in an embodiment furthermore comprises a plurality of junction box connections and by-pass diode connections 5 in the part of the two-by-two arrangement of PV-cells i,j in a further embodiment, allowing the connection of the junction box leads (towards further PV modules or towards an inverter/converter) and of the by-pass diodes. The by-pass diodes allow to make the PV module less sensitive to partial shading.

In yet a further embodiment, the back side connection layer comprises by-pass diodes connected in parallel to each of the preset number of strings 3. The by-pass diodes may even be incorporated in or integrated with the back side connection layer (allowing to include the by-pass diodes in the PV module encapsulation).

Figure 2B:
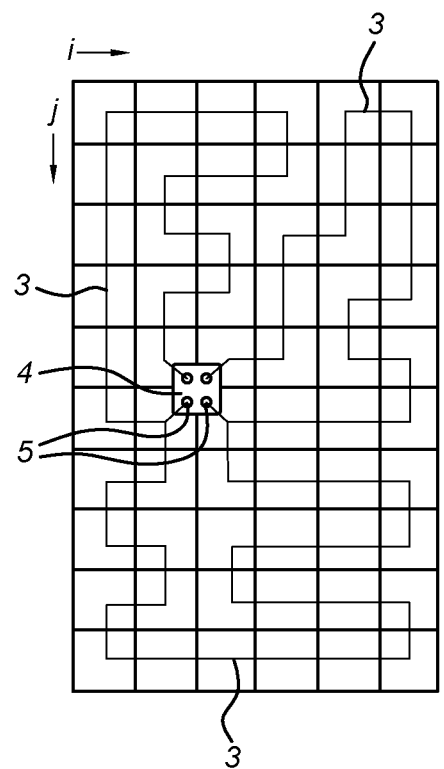

In FIG. 2b, an alternative arrangement is shown, wherein the preset number of strings of series connected cells i,j is three. The junction box 4 is positioned similar to the embodiment of FIG. 2a, however, the number of cells i,j per string is now different and unequal per string (18-18-24), in contrast to the equal division of 20 cells per string in the embodiment of FIG. 2a.

The present invention embodiment can be applied in the nowadays mainly used configuration of 6×10 and 6×12 arrays of cells i,j.

Figure 3:
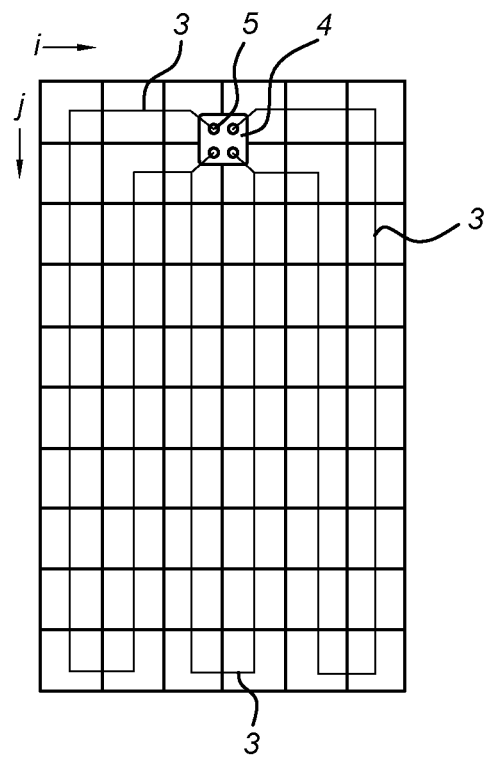
FIG. 3-9 show schematic views of a PV panel with multiple strings, arranged according to further embodiments of the present invention.
Figure 4:
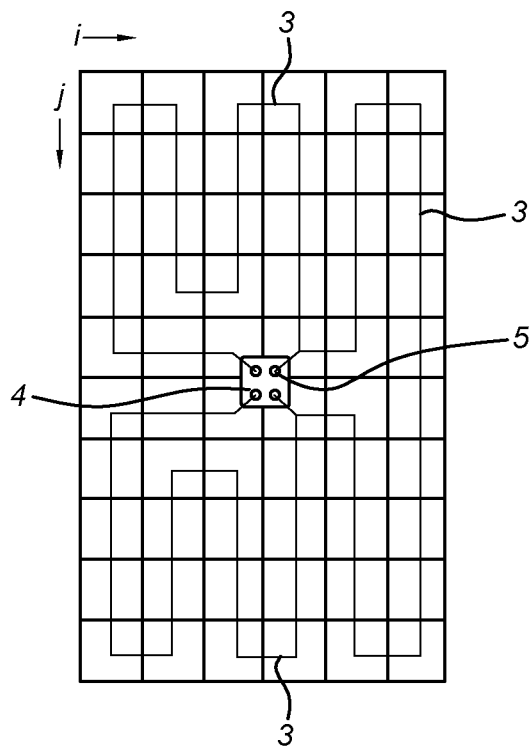
Figure 5:
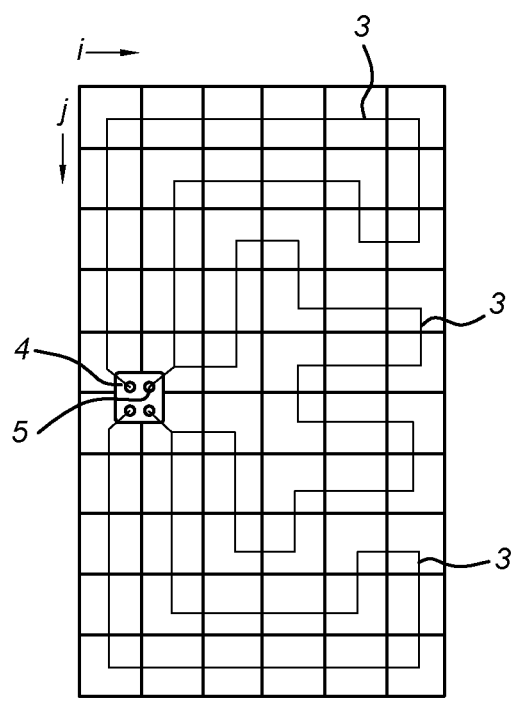
Figure 6:
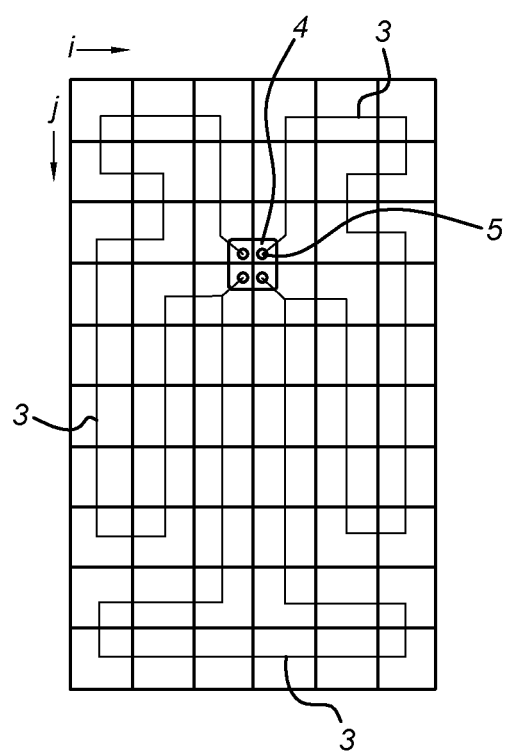

Other variants of the present invention embodiments are shown in FIG. 3 (junction box 4 at cells (3,1); (4,1); (3,2); (4,2); three unequal strings 22-17-21); FIG. 4 (junction box 4 at cells (3,5); (4,5); (3,6); (4,6); three unequal strings 20-21-19); FIG. 5 (junction box 4 at cells (1,5); (2,5); (1,6); (2,6); three equal strings 20-20-20); and FIG. 6 (junction box 4 at cells (3,3); (4,3); (3,4); (4,4); three equal strings 20-20-20).

In further embodiments, the number of strings is four, allowing the use of smaller strings, and at the expense of one additional by-pass diode, a better partial shading performance.

Figure 7:
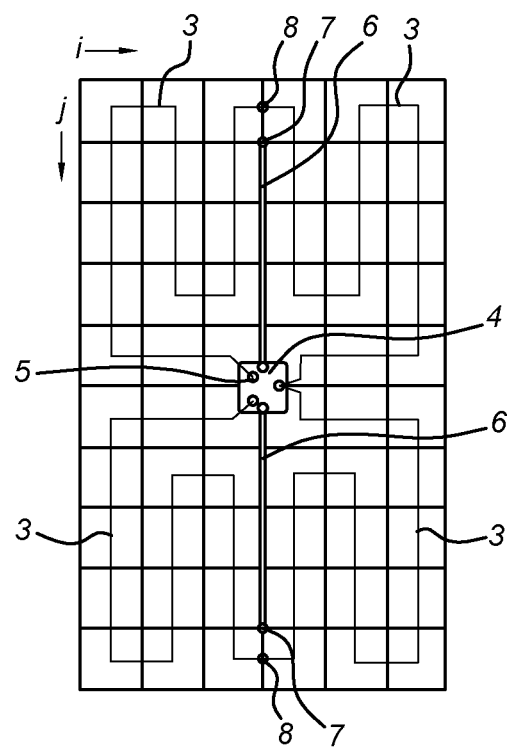

In order to cater for more than three strings, it is often needed to apply an additional conductive routing to allow connection of the needed by-pass diodes, in general outside of the two-by-two array arrangement of cells i,j where the junction box 4 is located. To that end the back side connection layer further comprising one or more by-pass diode conductors 6 provided as part of the back side connection layer. A first exemplary embodiment of this configuration is shown in FIG. 7. The junction box 4 is located in the middle of the PV module, i.e. at cells (3,5); (4,5); (3,6); (4,6). Additional by-pass diode conductors 6 are provided in the back side connection layer running upward and downward to a connection point 7. The strings 3 are provided with additional connection points 8 close to the connection points 7 (i.e. between cells (3,1) and (4,1), and between cells (3,10) and (4,10), allowing connection of the by-pass diodes for bypassing the first and last string of the PV module. The other by-pass diodes may be connected using the connections 5 on the junction box 4.

Figure 8:
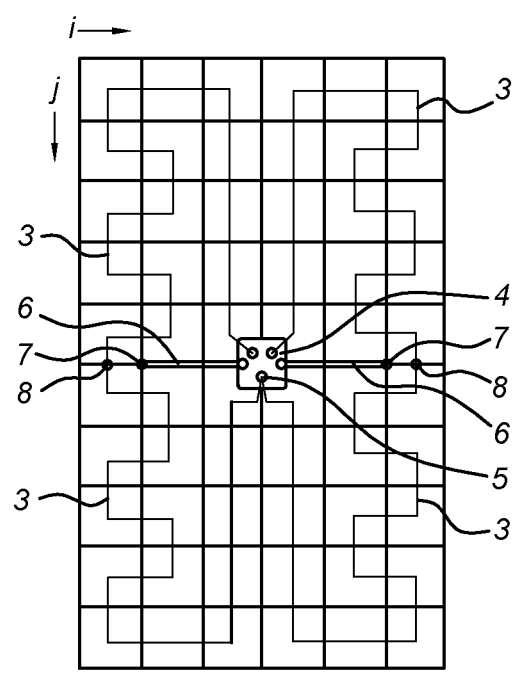
Figure 9:
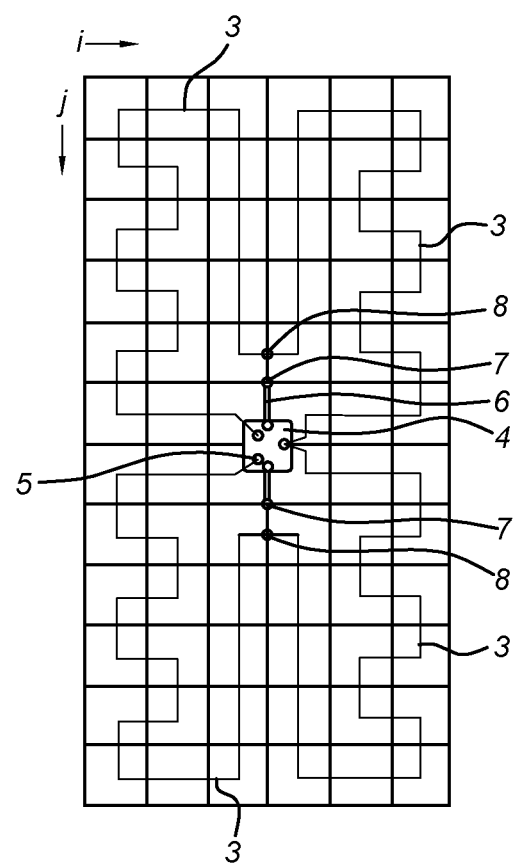

FIG. 8 shows an alternative arrangement of the FIG. 7 embodiment, where the by-pass diode conductors 6 run horizontally to connection points 7, i.e. from the junction box 4 close to the additional connection points 8 at the intersection of cells (1,5) and (1,6), and (6,5) and (6,6), respectively. FIG. 9 shows an embodiment with even shorter length by-pass diode conductors 6, i.e. from the junction box 4 close to the additional connection points 8 at the intersection of cells (3,5) and (4,5), and (3,8) and (4,8), respectively. note that the meandering pattern of the strings 3 in the embodiment of FIG. 9 may also be mirrored (i.e. the teeth like meander pointing inward instead of outward).

The by-pass diode conductors 6 may be simple straight line connecting patterns in the back side connection layer. However, in a further embodiment a by-pass diode connection path 6 is formed in the back side connection layer along an edge direction of two adjacent cells (i,j) with a meandering pattern around outer contacts of the plurality of back side contacts of the two adjacent cells (i,j). Especially in the case of providing a PV module as a metal foil-based module enabling back-contacted cells, including metal wrap through (MWT), emitter wrap through (EWT) and interdigitated back contact (IBC) cells, where the bypass diode connection is fully integrated within the junction box, this may be very advantageous as it allows to use by-pass diode conductors 6 having a larger width and thus current carrying capacity.

In view of the above, PV modules may be provided having a back side connection layer according to one of the embodiments described. In other wording, a configuration of a PV module having back contact solar cells in series connection via a PCB-like (Cu) foil (back side connection layer), is provided. The configuration/topology of the cells i,j is such that four cells i,j, including the first and last cell in the series connection, meet at a single corner point. The four cells i,j in that corner form three strings of cells 3. A junction box 4 is placed on the outside of the module. Openings in the back sheet allow connecting the junction box terminals, including bypass diodes, directly to the corresponding Cu foil piece and the three strings are bypass diode protected. Many variants are possible for re-arranging the topology of the serial interconnection of the cells such that all cells to be contacted are located at the same corner, as exemplified by the embodiments described in the FIG. 2-9 and described above.

The present invention embodiments have been described above with reference to a number of exemplary embodiments as shown in the drawings. Modifications and alternative implementations of some parts or elements are possible, and are included in the scope of protection as defined in the appended claims.

The invention claimed is:

1. A photovoltaic module comprising a plurality of PV-cells and a back side connection layer, the plurality of PV-cells being of a type having one or more back side contacts, wherein the plurality of PV-cells is divided in a preset number of strings of series connected PV-cells, each string comprising a first PV-cell and a last PV-cell, and by-pass diodes are connectable in parallel to each of the preset number of strings, wherein the preset number of strings comprises a first string, a second string, and a third string, and wherein contacts to the plurality of PV-cells are provided on the back side connection layer and are positioned such that externally accessible electrical connections to the first PV-cell and last PV-cell of each of the first, second, and third strings are provided in a part of the back side connection layer underlying a part of an area defined by the perimeter of a two-by-two arrangement of PV-cells, wherein the two-by-two arrangement of PV-cells comprises the first and last PV-cells of the first string and the first and last PV-cells of the third string, and wherein the connection to the first PV-cell of the second string is provided directly via the connection to the last PV-cell of the first string and the connection to the last PV-cell of the second string is provided directly via the connection to the first PV-cell of the third string.

2. The photovoltaic module according to claim 1, wherein the part of the back side connection layer overlaps four adjacent corner areas of the two-by-two arrangement of PV-cells.

3. The photovoltaic module according to claim 1, wherein the back side connection layer furthermore comprises a plurality of junction box connections and by-pass diode connections in the perimeter of the two-by-two arrangement of PV-cells.

4. The photovoltaic module according to claim 1, wherein the back side connection layer comprises by-pass diodes connected in parallel to each of the preset number of strings.

5. The photovoltaic module according to claim 1, wherein the preset number of strings is three.

6. The photovoltaic module according to claim 1, wherein the back side connection layer is arranged to connect a 6×12 array of PV-cells.

7. The photovoltaic module according to claim 1, wherein the back side connection layer is arranged to connect a 6×10 array of PV-cells.

8. The photovoltaic module according to claim 1, wherein the preset number of strings is four.

9. The photovoltaic module according to claim 1, further comprising one or more by-pass diode conductors provided as part of the back side connection layer.

10. The photovoltaic module to claim 1, wherein a by-pass diode connection path is formed in the back side connection layer along an edge direction of two adjacent PV-cells with a meandering pattern around outer contacts of the plurality of back side contacts of the two adjacent PV-cells.

11. A backside connection layer for a PV module comprising a plurality of PV cells comprising at least a two-by-two arrangement of PV cells extending over a first area bounded by an outer perimeter, the backside connection layer comprising electrically conductive material:
 a first conductive pathway configured to connect a first group of PV cells of the PV module in series to form a first string of PV cells connectable in parallel to a first bypass diode;
 a second conductive pathway configured to connect a second group of PV cells of the PV module in series to form a second string of PV cells connectable in parallel to a second bypass diode;
 a third conductive pathway configured to connect a third group of PV cells of the PV module to form a third string of PV-cells connectable in parallel to a third bypass diode;
 wherein the backside connection layer further comprises externally accessible backside electrical connections for connecting to a first PV-cell and a last PV-cell of each of the first, second and third strings, and wherein the backside electrical connections are provided within the outer perimeter defined by the two-by-two arrangement of PV-cells;
 wherein the two-by-two arrangement of PV-cells comprises the first and last PV-cells of the first string and the first and last PV-cells of the third string, and
 wherein the connection to the first PV-cell of the second string is provided directly via the connection to the last PV-cell of the first string and the connection to the last PV-cell of the second string is provided directly via the connection to the first PV-cell of the third string.

12. The backside connection layer according to claim 11, wherein the backside connection layer furthermore comprises a plurality of junction box connections and by-pass diode connections within the outer perimeter.

13. The backside connection layer according to claim 11, wherein the backside connection layer comprises by-pass diodes connected in parallel to each of the preset number of strings.

14. The backside connection layer according to claim 11, wherein the backside connection layer further comprises additional conductive paths to form further strings of PV cells.

15. The backside connection layer according to claim 11, wherein the backside connection layer is arranged to connect a 6×12 array of PV cells or a 6×10 array of PV cells.

16. A back side connection layer according to claim 11, wherein a by-pass diode connection path is formed in the back side connection layer with a meandering pattern around outer contacts of back side connections.

17. A PV module comprising a plurality of PV-cells and a back side connection layer according to claim 11.

* * * * *